United States Patent
Otwell et al.

(12)

(10) Patent No.: US 6,270,306 B1
(45) Date of Patent: *Aug. 7, 2001

(54) WAFER ALIGNER IN CENTER OF FRONT END FRAME OF VACUUM SYSTEM

(75) Inventors: Robert Otwell, San Jose; Eric A. Nering, Modesto; Bryan Von Lossberg, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,780

(22) Filed: Jan. 14, 1998

(51) Int. Cl.[7] ..................................... H01L 21/00
(52) U.S. Cl. ................ 414/222.13; 414/217; 414/416; 414/936; 414/937; 414/938; 414/806
(58) Field of Search .................... 414/217, 416, 414/222.04, 222.13, 936, 937, 939, 806

(56) References Cited

U.S. PATENT DOCUMENTS

| | | | |
|---|---|---|---|
| 4,836,733 | * 6/1989 | Hertel | 414/225 |
| 4,917,556 | * 4/1990 | Stark et al. | 414/217 |
| 4,923,584 | * 5/1990 | Branhall, Jr. et al. | 414/222.13 |
| 5,174,067 | * 12/1992 | Hasegawa et al. | 414/416 |
| 5,376,212 | 12/1994 | Saiki | 156/345 |
| 5,380,682 | 1/1995 | Edwards et al. | 437/225 |
| 5,405,230 | * 4/1995 | Ono et al. | 414/936 |
| 5,509,771 | 4/1996 | Hiroki | 414/217 |
| 5,609,689 | 3/1997 | Kato et al. | 118/719 |
| 5,711,646 | * 1/1998 | Ueda et al. | 414/222.13 |
| 5,740,034 | * 4/1998 | Saeki | 414/222.13 |
| 5,759,006 | * 6/1998 | Miyamoto et al. | 414/416 |

FOREIGN PATENT DOCUMENTS 0 308 275 A2   3/1989   (EP) ............... H01L/21/00
0 308 275 A3   3/1989   (EP) ............... H01L/21/00

* cited by examiner

Primary Examiner—Douglas Hess
(74) Attorney, Agent, or Firm—Thomason, Moser and Patterson, L.L.P.

(57) ABSTRACT

A vacuum processing system has a wafer handling chamber, such as a mini-environment, for moving wafers therethrough. The wafer handling chamber has a wafer aligner, or orienter, for aligning the wafers according to the requirements of a process that the wafer is to undergo in the system. The wafer aligner is disposed at a location in the wafer handling chamber to minimize the number of movements that the wafer makes as it passes through the wafer handling chamber, to minimize interference between wafer handlers, or robots, when more than one wafer handler is used in the wafer handling chamber and to minimize the footprint area of the system. The presence of the wafer aligner in the wafer handling chamber eliminates the need to provide a separate wafer aligning chamber in the system.

25 Claims, 6 Drawing Sheets

WAFER ALIGNER IN CENTER OF FRONT END FRAME OF VACUUM SYSTEM

FIELD OF THE INVENTION

The present invention generally relates to apparatuses used to handle wafers commonly used in the fabrication of integrated circuits and flat panel displays. Specifically, the present invention relates to placement and use of wafer aligners used in a vacuum processing system to align, or orient, a wafer according to the requirements of a process to be performed on the wafer in the vacuum processing system.

BACKGROUND OF THE INVENTION

Vacuum processing systems for processing 100 mm, 200 mm, 300 mm or other diameter wafers are generally known. An example of a typical vacuum processing system 10 is shown in FIG. 1a. The system 10 typically has a centralized transfer chamber 12 mounted on a monolith platform (not shown). The transfer chamber 12 is the center of activity for the movement of wafers being processed in the system. One or more process chambers 14 attach to the transfer chamber 12 at valves through which the wafers are passed by a robot 16 in the transfer chamber 12. The valves are selectively opened and closed to isolate the process chambers 14 from the transfer chamber 12 while wafers are being processed in the process chamber 14. Physically, the process chambers 14 are either supported by the transfer chamber 12 and its platform or are supported on their own platform. Inside the system 10, the transfer chamber 12 is typically held at a constant vacuum; whereas, the process chambers 14 may be pumped to a greater vacuum for performing their respective processes. Afterward, the chamber pressure must be returned to the level in the transfer chamber 12 before opening the valve to permit access between the chambers.

The transfer chamber 12 has facets to support four process chambers 14 and two load lock chambers 18. Other transfer chambers may have a total of only four or five facets. The process chambers 14 include rapid thermal processing (RTP) chambers, physical vapor deposition (PVD) chambers, chemical vapor deposition (CVD) chambers, etch chambers, etc. The productivity of a vacuum processing system 10 is increased when more process chambers 14 are mounted to the transfer chamber 12, because more wafers can be processed at a given time. Additionally, less space is required in the manufacturing facility if the productivity of the system is maximized.

Access to the transfer chamber 12 for wafers from the exterior of the system 10, or from the manufacturing facility, is typically through one or more load lock chambers 18. The load lock chambers 18 cycle between the pressure level of the ambient environment and the pressure level in the transfer chamber 12 in order for the wafers to be passed therebetween. The load lock chambers 18 attach to an optional mini-environment 20 which transfers wafers in a very clean environment at atmospheric pressure from wafer pods seated on pod loaders 22 to the load lock chambers 18. Typically, the transfer chamber 12 or the mini-environment 20 has a wafer orienter, or aligner 24 for aligning a wafer so that the wafer is properly oriented when it is loaded into a process chamber 14 or a load lock chamber 18. For systems 10 that do not have a mini-environment 20, the wafer aligner 24 is attached to the transfer chamber 12 at one of the locations for a process chamber 14. For systems 10 that have a mini-environment 20, the wafer aligner 24 is located in a small side chamber 26 attached to the mini-environment 20 between the pod loaders 22 as shown in FIG. 1a or at one end 60, 62 of the track system for the track-mounted robot 28. One or more track-mounted mini-environment robots 28, 29 transfer the wafers from the pod loaders 22 to the load lock chambers 18.

In a typical loading procedure in a mini-environment 20 having a wafer aligner side chamber 26, a robot 28 moves a wafer out of a pod positioned on a pod loader 22 in the direction of arrow A. The robot 28 moves to the wafer aligner 24 in the direction of arrow B. The robot 28 inserts the wafer into the wafer aligner 24 in the direction of arrow C. After the wafer aligner 24 aligns the wafer, the robot 28 retrieves the wafer in the direction of arrow D. The robot 28 moves in the direction of arrow E toward the load lock chamber 18 to position the wafer for delivery therein. Finally, the robot 28 inserts the wafer into the load lock chamber 18 in the direction of arrow F. Thus, six movements of the wafer are required to move the wafer from a pod to a load lock chamber 18. If the number of movements can be reduced, then the time to load the load lock chamber 18 can be reduced and the throughput of the system 10 increased.

A system 10 typically has only one robot 28, but if the system 10 has two robots 28, 29, as shown in FIG. 1a, then the two robots 28, 29 must share the wafer aligner 24 and the space directly in front of the wafer aligner 24 in the mini-environment. If the first robot 28 moves into this space to deliver a wafer to the wafer aligner 24 or a load lock chamber 18, then the first robot 28 may interfere with the second robot's performance. The first robot 28 must move out of the way before the second robot 29 can move into this space. Thus, if the movements of the robots 28, 29 are not carefully coordinated, then the second robot 29 may become idle while waiting for the first robot 28 to finish accessing the wafer aligner 24 or the load lock chamber 18. Time spent waiting by one robot 29 for the other robot 28 to move causes an increase in the time to load the wafers and a decrease in the throughput of the system 10.

Another example of a typical vacuum processing system 30 is shown in FIG. 1b. This example has a transfer chamber 32 mounted on a monolith platform (not shown) and four process chambers 34 mounted to the transfer chamber 32 similar to the example in FIG. 1a, but the system 30 also has a buffer chamber 36 for staging the movement of wafers through the system 30 and for providing pre-processing and post-processing of the wafers as needed. Disposed between the transfer chamber 32 and the buffer chamber 36 are a pre-clean chamber 38 and a cool-down chamber 40. The buffer chamber robot 42 places wafers to be processed into the pre-clean chamber 38, and the transfer chamber robot 44 removes the wafers from the pre-clean chamber 38 and transfers the wafers to one or more process chambers 34 for processing. The pre-clean chamber 38 provides cleaning of the wafers and transitioning from the buffer chamber pressure to the transfer chamber pressure. After processing, the transfer chamber robot 44 places the wafers in the cool-down chamber 40, and the buffer chamber robot 42 removes the wafers from the cool-down chamber 40. The cool-down chamber 40 provides for post-process cooling of the wafers and for pressure transitioning from the transfer chamber pressure to the buffer chamber pressure. The buffer chamber robot 42 transfers the wafers to the load lock chambers 46 for return to the ambient environment or transfers the wafers to an expansion chamber 48 for additional processing or post-processing or to a cool-down chamber 50 for further cooling before transferring the wafers to the load lock chambers 46. The load lock chambers 46 transition the wafers between the buffer chamber pressure and the ambient environment pressure.

As in the system 10 shown in FIG. 1a, the load lock chambers 46 have an optional mini-environment 54 attached thereto. The mini-environment 54 has pod loaders 56 attached thereto and one or more mini-environment robots 58 disposed therein for moving the wafers between the load lock chambers 46 and wafer pods seated on the pod loaders 56. The mini-environment 54, however, does not have a wafer aligner in a side chamber, because such systems 30 have typically attached a wafer aligner chamber 52 to the buffer chamber 36 for aligning the wafers and permitting the wafers to degas after they pass through the load lock chambers 46. However, it is possible to place a side chamber on the mini-environment 54 for housing a wafer aligner at a location 64 between the pod loaders 56 or at one of the ends 66, 68 of the track system for the track-mounted robot 224, as shown in FIG. 1a. The buffer chamber robot 42 moves the wafers from the load lock chambers 46 to a wafer aligner in the wafer aligner chamber 52 and then to the pre-clean chamber 38, or to an expansion chamber 48 for pre-processing if necessary before transferring the wafers to the pre-clean chamber 38. In this system 30, the wafer movement in the mini-environment 54 requires only three basic steps to move the wafers from the pod loaders 56 to the load lock chambers 46, but the wafer movement in the buffer chamber 36 requires extra steps to move the wafers into and out of the wafer aligner chamber 52. These extra steps in the movement of wafers in the buffer chamber 36 increase the time required to transfer wafers therethrough and decrease the throughput of the system 30. Additionally, since the wafer aligner chamber 52 occupies one of the facets on the buffer chamber 36 that could be used by another chamber for performing a pre-processing or post-processing step on the wafers, the throughput of the system 30 may be further reduced.

A need, therefore, exists for a mini-environment with a placement and configuration of a wafer aligner that provides for a minimum number of wafer movements and a minimum amount of robot interference in order to maximize system throughput.

SUMMARY OF THE INVENTION

An embodiment of the invention provides a vacuum processing system having a mini-environment, for transferring wafers from pod loaders to load lock chambers, and a wafer aligner disposed within the mini-environment. Preferably, the wafer aligner is positioned along the path of the wafer from the pod to the load lock chamber or at least as near thereto as possible. The system also includes a transfer chamber, which mounts the load lock chambers and one or more process chambers. The wafer aligner aligns, or orients, the wafers prior to loading the wafers in the load lock chambers.

A robot disposed within the mini-environment moves a wafer from one of the pod loaders to the wafer aligner for alignment and then to one of the load lock chambers. The load lock chambers transition the wafer to the vacuum pressure in the transfer chamber. The transfer chamber transfers the wafer to the appropriate process chamber for performing the process which dictated the alignment of the wafer.

The preferred location for the wafer aligner is above the robot in the middle of the mini-environment so that the wafer can be inserted directly into the wafer aligner from any position along a line that is approximately halfway between the front side of the mini-environment, where the pod loaders are typically attached, and the rear side of the mini-environment, where the load lock chambers are attached. In this configuration, the robot can move the wafer from one end of the mini-environment to the wafer aligner in the same amount of time that it can move the wafer from the other end of the mini-environment to the wafer aligner. An exemplary movement of the wafer in the mini-environment includes four straight-line steps: moving the wafer into the mini-environment, moving the wafer directly into the wafer aligner in a line that is substantially in a direct line of movement from the pod to the load lock chamber, moving the wafer out of the wafer aligner, and moving the wafer into the load lock chamber.

An advantage of the above described configuration is the speed with which the wafer can be moved through the mini-environment. The configuration requires fewer motions to move the wafer into the system than currently available and results in a higher throughput. Another advantage of this configuration is that it provides an aligner accessible from at least two directions, so that it is possible to insert the wafer into the wafer aligner from one side, then move the robot under the wafer aligner to the other side while the wafer aligner is performing the alignment, and then remove the wafer from this other side in order to insert the wafer into the load lock that is furthest from the wafer pod without losing any time in doing so. This series of movements places the wafer in the wafer aligner directly in line with the line of motion from the pod to the load lock chamber. Yet another advantage of this configuration is that it is possible to have two robots, one on either side of the wafer aligner, that both use the same wafer aligner without interfering with the movement of each other, or in order to minimize wafer transfer time, one robot can be used to move wafers from a wafer pod to the aligner while the other robot is used to move wafers from the aligner to the load lock chamber that is furthest from the wafer pod. Another advantage of locating the wafer aligner inside the mini-environment is a reduction in the foot-print area of the system, since space does not need to be provided between two pod loaders for inserting a wafer in a side chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Figure 1A:
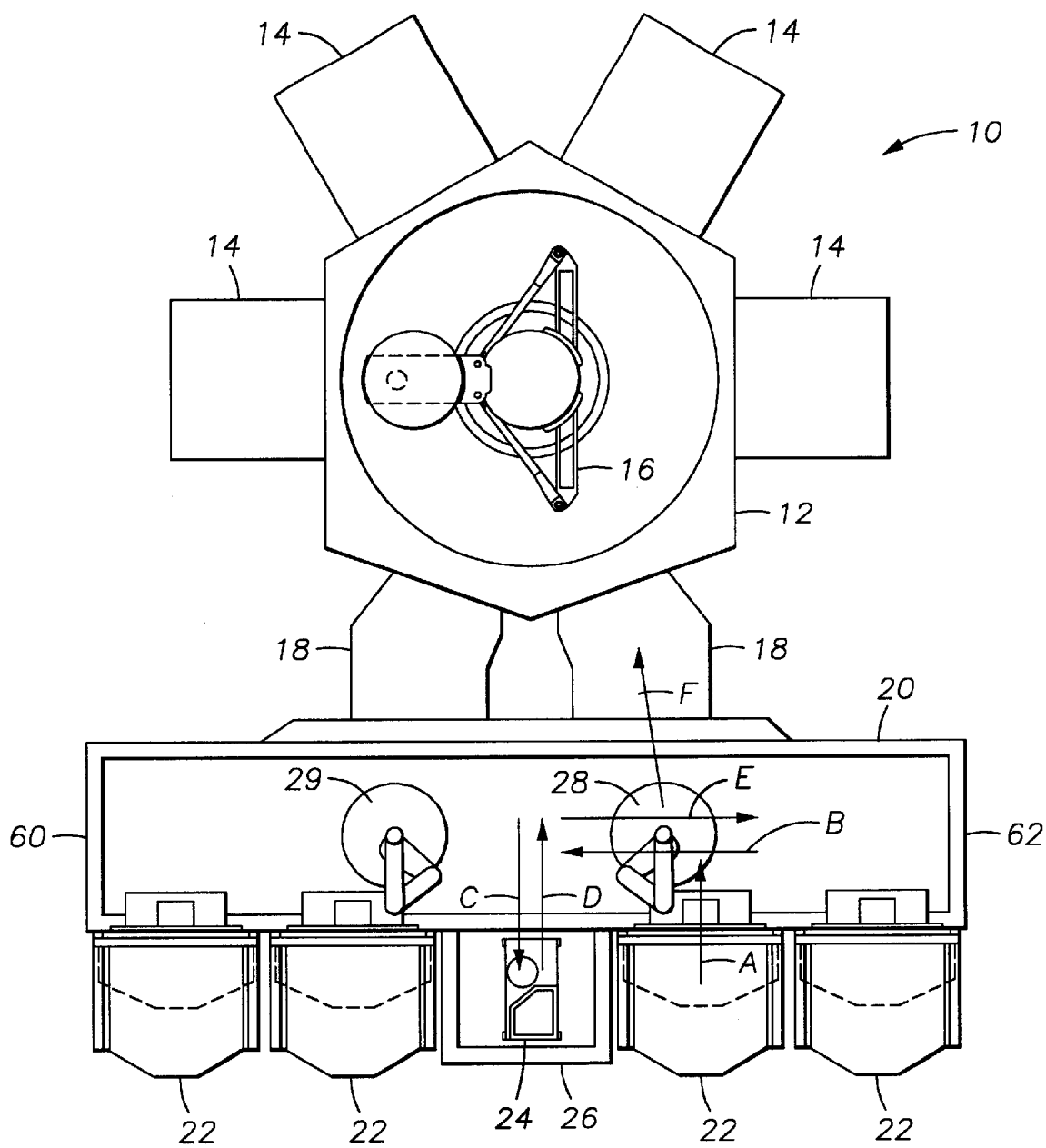
FIG. 1a is a prior art top schematic view of a vacuum processing system.
Figure 1B:
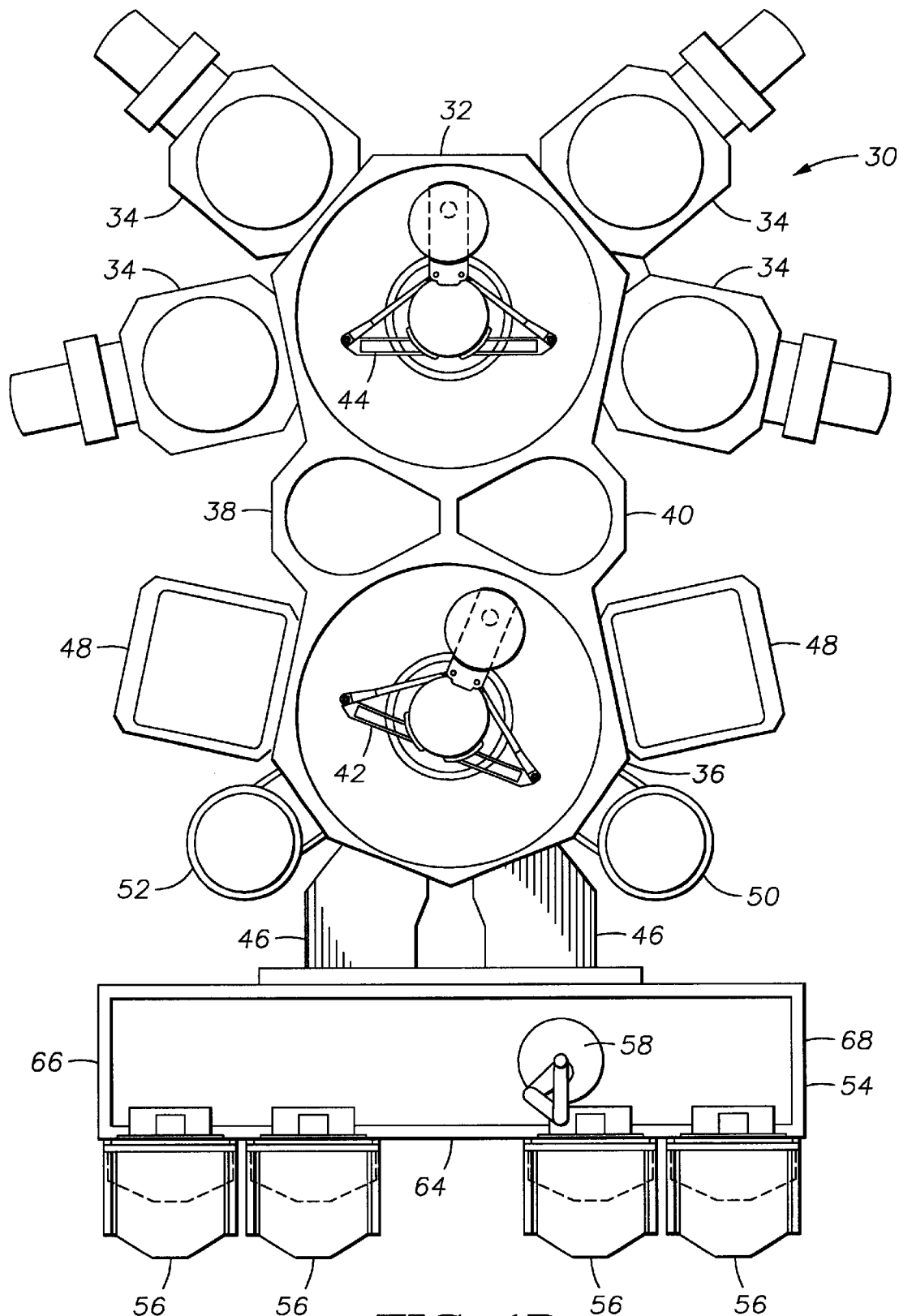
FIG. 1b is a prior art top schematic view of another embodiment of a vacuum processing system.
Figure 2:
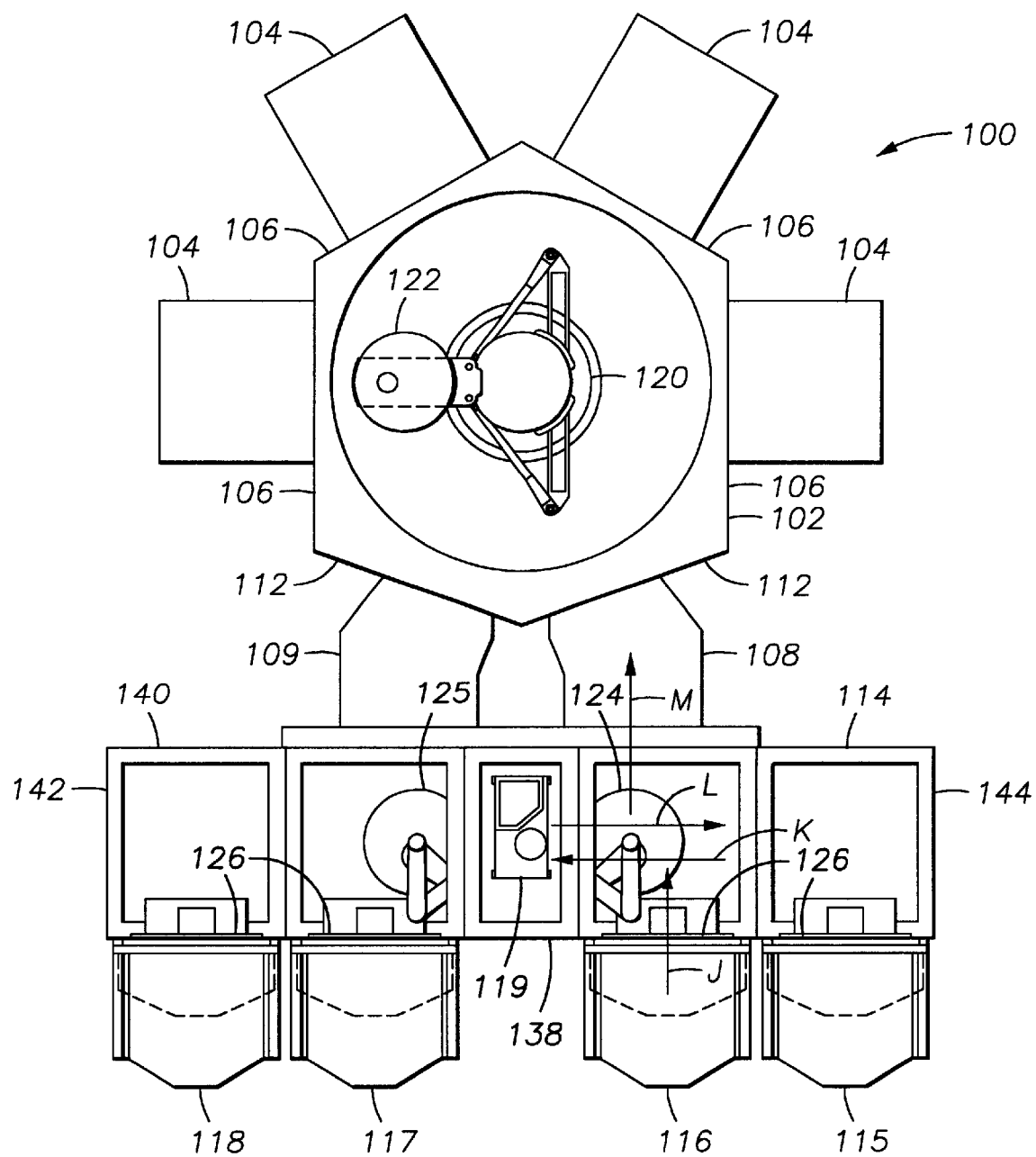
FIG. 2 is a top schematic of a first embodiment of a vacuum processing system incorporating the present invention.

FIG. 2 generally shows a schematic top view of an embodiment of a vacuum processing system 100 of the present invention. This system 100 is an example of the Centura™ system available from Applied Materials, Inc. The vacuum processing system 100 includes a transfer chamber 102 typically mounted on a platform (not shown). The transfer chamber 102 has four process chambers 104 mounted at facets 106 and two load lock chambers 108 mounted at facets 112. A mini-environment, or wafer handling chamber, 114 attaches to the load lock chambers 108. A wafer aligner 119 is disposed within the mini-environment 114 so that it is substantially in or near the pathway of a wafer being moved from a pod loader 115–118 to a load lock chamber 108. In the embodiment shown in FIG. 2, the wafer aligner 119 is mounted on a shelf (not shown in FIG. 2, but shown in FIG. 6) roughly in the center of the mini-environment 114, halfway between the front wall 138 and the rear wall 140 and between the two side walls 142, 144. Additionally, in this embodiment, the wafer aligner 119 is positioned high enough such that the robot can pass under the wafer aligner 119 in order to move from one side of the mini-environment to the other. To minimize wafer movement, the aligner is positioned at an elevation such that the aligner wafer chuck is at the height of the middle of the load lock chamber 108 or at the average combined wafer height of the load lock chamber 108 and the pod loader 115–118. The wafer aligner 119 centers the wafers and orients the direction of the wafers according to the requirements of a process that the wafers are to undergo in the process chambers 104. The wafer aligner 119 will be described in detail with reference to FIGS. 4 and 5 below. An example of a wafer aligner 119 is the PRE 200 Series Wafer Pre-Aligner available from Equipe Technologies of Sunnyvale, Calif.

The process chambers 104 perform the wafer process on the wafers in the vacuum processing system 100. Process chambers 104 may be any type of process chamber, such as a rapid thermal processing chamber, a physical vapor deposition chamber, a chemical vapor deposition chamber, an etch chamber, etc. It is not uncommon for a manufacturer of process chambers to provide over twenty different types of process chambers. The process chambers 104 may be supported by the transfer chamber 102 or may be supported on their own platforms depending on the configuration of the individual process chambers 104. Slit valves (not shown) in the facets 106 provide access and isolation between the transfer chamber 102 and the process chambers 104. Correspondingly, the process chambers 104 have openings (not shown) on their surfaces that align with the slit valves.

The load lock chambers 108 transition one wafer at a time between the ambient environment pressure to the transfer chamber vacuum pressure. Openings (not shown) in facets 112 provide access and valves provide isolation between the load lock chambers 108 and the transfer chamber 102. Correspondingly, the load lock chambers 108 have openings on their surfaces that align with the openings in facets 112. The load lock chambers 108 and the mini-environment 114 have corresponding openings (not shown) providing access therebetween, while doors (not shown) for the openings provide isolation.

The mini-environment 114 has four pod loaders 115–118 attached on its front side 138, two on either side of the wafer aligner 119. Openings (not shown) with corresponding doors 126 provide access and isolation between the mini-environment 114 and the pod loaders 115–118. The pod loaders 115–118 are mounted on the side of the mini-environment 114 and are essentially shelves for supporting the wafer pods (not shown) used to transport the wafers to and from the vacuum processing system 100. The wafer pods form a seal with the pod doors before the door into the mini-environment 114 is opened.

A robot 120, or wafer handler, is disposed within the transfer chamber 102 for transferring a wafer 122 between the load lock chambers 108 and the process chambers 104. Likewise, one or more robots 124, 125 are disposed within the mini-environment 114 for transferring the wafers between the pod loaders 115–118, the wafer aligner 119, and the load lock chambers 108. An example of this type of robot 124, 125 is the ATM-105 available from Equipe Technologies of Sunnyvale, Calif.

Figure 6:
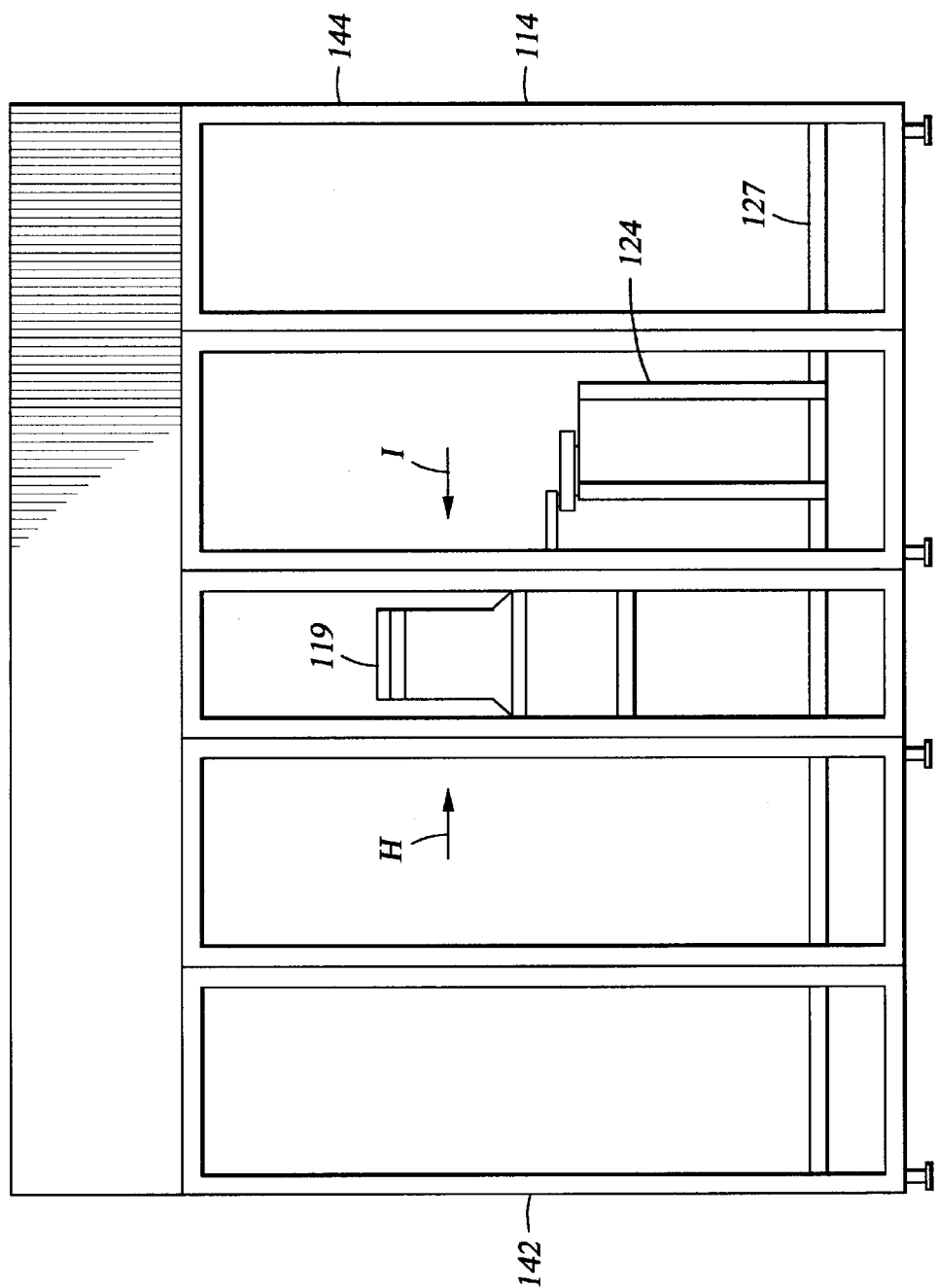
FIG. 6 is a simplified side view of a mini-environment.

In the event that the mini-environment 114 has only one robot 124 the wafer aligner 119 may be placed, as shown in the simplified side view of FIG. 6, so that the robot 124 may pass under the wafer aligner 119 in order to service both ends of the mini-environment 114. The robot 124, 125 is typically mounted on a track 127 so the robot 124, 125 can move back and forth in the mini-environment 114.

Figure 3:
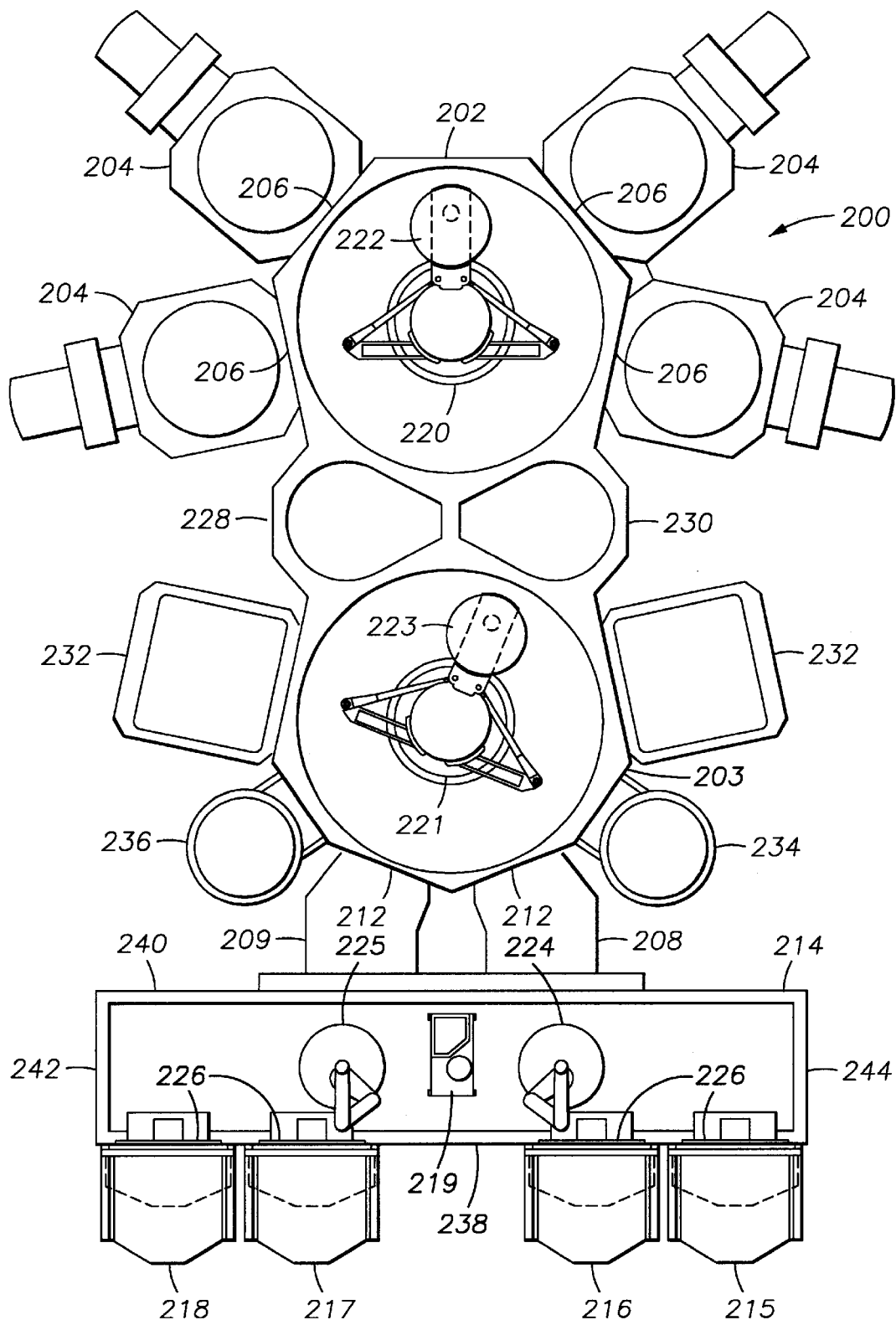
FIG. 3 is a top schematic of a second embodiment of a vacuum processing system incorporating the present invention.

FIG. 3 generally shows a schematic top view of another embodiment of a vacuum processing system 200 of the present invention. This system 200 is an example of the Endura™ system available from Applied Materials, Inc. Like the system 100 shown in FIG. 2, this system 200 is of the type that is typically used for manufacturing integrated circuits on wafers in a vacuum. The vacuum processing system 200 includes a transfer chamber 202 and a buffer chamber 203 typically mounted on a platform (not shown) and generally forming a system monolith. The system monolith has two load lock chambers 208, 209 mounted at facets 212. A mini-environment 214 attaches to the load lock chambers 208, 209. A wafer aligner 219 is mounted on a shelf (not shown) disposed within the mini-environment 214 so that it is substantially in or near the pathway of a wafer being moved from a pod loader 215–218 to a load lock chamber 208, 209. The wafer aligner 219 may be similar to the wafer aligner 119 shown in FIG. 2 for aligning the wafers according to a process that the wafers are to undergo in the system 200.

The transfer chamber 202 has four process chambers 204 mounted at facets 206. A pre-clean chamber 228 and a cool-down chamber 230 are disposed between the transfer chamber 202 and the buffer chamber 203. The pre-clean chamber 228 cleans the wafers before they enter the transfer chamber 202, and the cool-down chamber 230 cools the wafers after they have been processed in the process chambers 204. The pre-clean chamber 228 and the cool-down chamber 230 may also transition the wafers between the vacuum levels of the transfer chamber 202 and the buffer chamber 203. The buffer chamber 203 has two expansion chambers 232 for performing additional processes on the wafers. The buffer chamber 203 further has a cool-down chamber 234 for further cooling the wafers if necessary. A location for an additional expansion chamber 236 is provided on the buffer chamber 203, since there is no need for a separate wafer aligner chamber attached to the buffer chamber 203.

The process chambers 204 perform the wafer process on the wafers in the vacuum processing system 200. Process chambers 204 may be any type of process chamber, such as a rapid thermal processing chamber, a physical vapor deposition chamber, a chemical vapor deposition chamber, an etch chamber, etc. The process chambers 204 may be supported by the transfer chamber 202 or may be supported on their own platforms depending on the configuration of the individual process chambers 204. Slit valves (not shown) in the facets 206 provide access and isolation between the transfer chamber 202 and the process chambers 204. Correspondingly, the process chambers 204 have openings (not shown) on their surfaces that align with the slit valves.

The load lock chambers 208, 209 transition the wafers between the ambient environment pressure to the buffer chamber vacuum pressure. Openings (not shown) in facets 212 provide access and valves provide isolation between the load lock chambers 208, 209 and the buffer chamber 203. Correspondingly, the load lock chambers 208, 209 have openings on their surfaces that align with the openings in facets 212. The load lock chambers 208, 209 and the mini-environment 214 have corresponding openings (not shown) providing access therebetween, while doors (not shown) for the openings provide isolation.

The mini-environment 214 is similar to the mini-environment 114 shown in FIG. 2. The mini-environment 214 has four pod loaders 215–218 attached on its front side. Openings (not shown) with corresponding doors 226 provide access and isolation between the mini-environment 214 and the pod loaders 215–218. The pod loaders 215–218 are mounted on the side of the mini-environment 214 and are essentially shelves for supporting the wafer pods (not shown) used to transport the wafers to and from the vacuum processing system 200.

A robot 220, or wafer handler, is disposed within the transfer chamber 202 for transferring a wafer 222 between the pre-clean chamber 228 and the cool-down chamber 230 and the process chambers 204. A similar robot 221 is disposed within the buffer chamber 203 for transferring a wafer 223 between the load lock chambers 208, 209, the expansion chambers 232, the cool-down chamber 234, the additional expansion chamber 236, the pre-clean chamber 228 and the cool-down chamber 230. Likewise, one or more robots 224, 225 are disposed within the mini-environment 214 for transferring the wafers between the pod loaders 215–218, the wafer aligner 219, and the load lock chambers 208, 209. As described above regarding the mini-environment 114 shown in FIGS. 2 and 6, in the event that the mini-environment 214 has only one robot 224, 225, the wafer aligner 219 may be placed so that the robot 224, 225 may pass underneath or beside the wafer aligner 219 in order to service both ends of the mini-environment 214. The robot 224, 225 is typically mounted on a track so the robot 224, 225 can move back and forth in the mini-environment 214.

Figure 4:
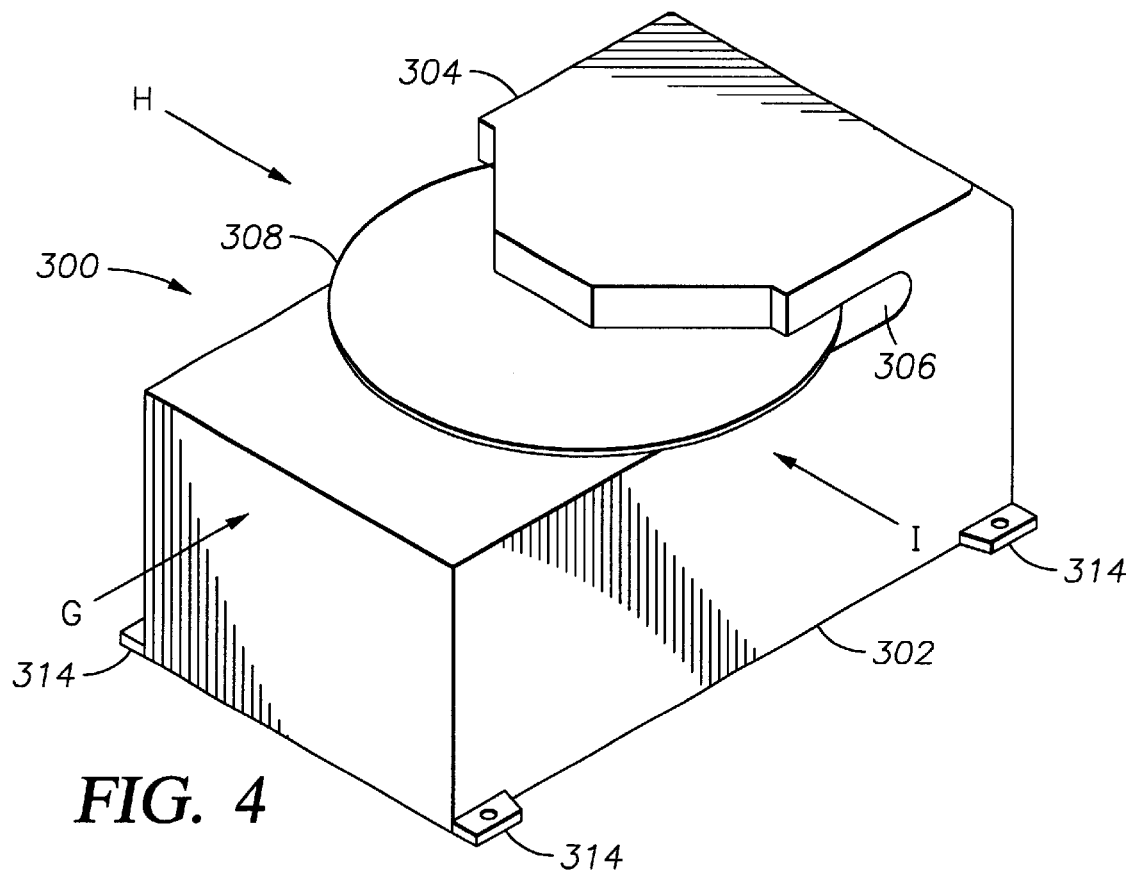
FIG. 4 is a perspective view of a wafer aligner.
Figure 5:
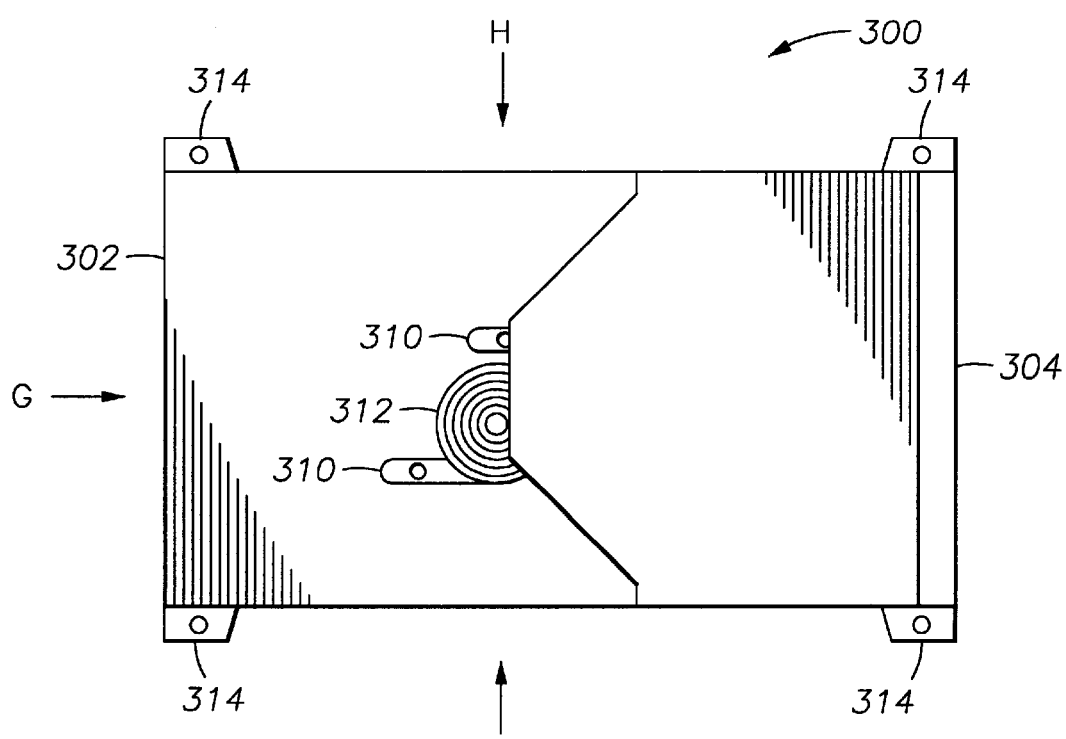
FIG. 5 is a top plan view of a wafer aligner.

FIGS. 4 and 5 show an exemplary wafer aligner 300 that may be used in the present invention. However, the present invention is not limited to this one embodiment of a wafer aligner, since other wafer aligners may be used in accordance with the present invention. The wafer aligner 300 must have a clean design and particle control measures to prevent shedding of particles onto a wafer surface either while in transit or in any stationary locations within the system. The wafer aligner 300 has a body portion 302 and an upper sensor portion 304 with a recess 306 in between. The sensors for detecting the position of a wafer 308 and the pins 310 and chuck 312 for lifting and moving the wafer 308 are generally disposed within the recess 306 or on the top surface of the body portion 302. In one embodiment, the sensors have high-resolution optical sensing with a highly linear light source and a charge coupled device sensor.

A wafer 308 is inserted in the direction of arrow G, H or I into the recess 306 by a blade, or end effector, of a mini-environment robot 124, 224, 225 until the center of the wafer is over the center of the chuck 312, the wafer center insertion point. The chuck 312 receives the wafer 308 from the robot blade. The chuck 312 rotates the wafer allowing the sensors to scan and measure the edge of the wafer in order to determine the center of the wafer and the orientation of the wafer. The chuck 312 stops the wafer in a position such that the true wafer center is aligned along the direction of arrow G. The pins 310 lift the wafer off of the chuck 312 and move the wafer along the direction of arrow G in order to center the wafer on the chuck 312. The pins 310 set the wafer down on the chuck 312 and the chuck 312 rotates the wafer again in about two to five seconds in order to orient the notch or major flat of the wafer as needed by the processing system.

The wafer aligner 300 is provided with flanges 314 for mounting the wafer aligner 300 to a support structure disposed within the mini-environment 114, 214 with appropriate fasteners, such as screws or bolts. The support structure may be any appropriate supporting mechanism, such as a shelf cantilevered from one of the walls 138, 140, 238, 240 of the mini-environment, or a pair of brackets suspended between the front wall 138, 238 and the rear wall 140, 240.

For a wafer aligner 300 that is placed in the center of a mini-environment 114, 214, similar to the wafer aligners 119, 219 shown in FIGS. 2 and 3, and accessed from two directions, the wafer aligner 300 may be placed in the mini-environment 114, 214 with the direction indicated by arrow G facing toward the front wall 138, 238 or the rear wall 140, 240 of the mini-environment 114, 214. Thus, the directions indicated by arrows H and I may face toward the left side wall 142, 242 or the right side wall 144, 244. Furthermore, for an even flow of wafer movements in the mini-environment 114, 214, it may be preferable to position the wafer aligner 119, 219 so that the center of the chuck 312 is about in the center of the mini-environment 114, 214. In order to minimize wafer movement, the wafer aligner 300 is positioned at an elevation such that the aligner wafer chuck 312 is at the average combined wafer height of the load lock chambers 108, 109, 208, 209 and the pod loaders 115–118, 215–218. With this placement, the robots 124, 125, 224, 225 have equal access to the wafer aligner 119, 219 from either direction indicated by arrows H and I. Since the robots 124, 125, 224, 225 do not have to move in front of the wafer aligner 119, 219, but rather can access the wafer aligner 119, 219 from two directions H and I, only a minimum amount of time will ever be spent by either robot 124, 125, 224, 225 waiting for the other robot 124, 125, 224, 225 to remove a wafer from the wafer aligner 119, 219. In fact, proper sequencing of events can prevent the robots 124, 125, 224, 225 from ever interfering with each other's performance.

An alternative method of operation for a mini-environment 114, 214 with two robots 124, 125, 224, 225 is to have one robot 124, 224 moving the wafers from the pod loaders 115, 116, 215, 216 to the wafer aligner 119, 219 on a first side while the other robot 125, 225 moves the wafers from the wafer aligner 119, 219 to the load lock chambers 109, 209 on a second side. This alternative method of operation with two robots allows for maximum wafer handling speed as one robot 124, 224 moves a wafer from a pod loader 115, 116, 215, 216 to the wafer aligner 119, 219 while the other robot 125, 225 moves the prior wafer from the wafer aligner 119, 219 to a load lock chamber 109, 209 and while the wafer aligner 119, 219 centers and orients another wafer. In an exemplary operation, the robot 124, 224 removes a wafer from the pod loader 116, 216 and moves the wafer to the wafer aligner 119, 219. After leaving the wafer in the wafer aligner 119, 219, the robot 124, 224 returns to the pod loader 116, 216 for the second wafer. After the wafer aligner 119, 219 centers and aligns the first wafer, the other robot 125, 225 removes the first wafer and moves it to the load lock chamber 109. While the robot 125, 225 moves the first wafer to the load lock chamber 109, the robot 124, 224 is moving the second wafer to the wafer aligner 119, 219. While the wafer aligner 119, 219 centers and aligns the second wafer, the robot 125, 225 is returning to the wafer aligner 119, 219 to obtain the second wafer and the robot 124, 224 is returning to the pod loader 116, 216 to obtain the third wafer. Thus, the functions of the wafer aligner 119, 219 and the robots 124, 125, 224, 225 overlap to reduce the overall time to move all of the wafers from a pod loader 115–118, 215–218 to a load lock chamber 108, 109, 208, 209. In an alternative embodiment, the robot 124, 224 may unload wafers from the load lock chamber 108, 208 to the pod loader 115, 215 in between movements of wafers from the pod loader 116, 216 to the wafer aligner 119, 219.

Alternatively, a mini-environment 114, 214 having only one robot 124, 224 (FIG. 6) may allow the robot to pass under or beside the wafer aligner 119, 219 in order to service the pod loaders 115–118, 215–218 and load lock chambers 108, 109, 208, 209 at both ends of the mini-environment 114, 214. Additionally, if a single robot 124, 224 is used to transfer a wafer from a pod loader 117, 118, 217, 218 near the side 142, 242 to a load lock chamber 108, 208 near the opposite side 144, 244, then the robot 124, 224 may insert a wafer in the direction of arrow H (FIGS. 4–6), pass under the wafer aligner 119, 219 while the wafer is being aligned, and retrieve the wafer from the direction of arrow I, without taking any more time than it would take to service a pod loader 115–118, 215–218 and a load lock chamber 108, 208, 209 on the same side of the wafer aligner 119, 219. Furthermore, this maneuver avoids moving the wafer under the wafer aligner 119, 219, thus avoiding any particle adders that would come from the wafer aligner 119, 219 as the wafer moved under it.

In a typical operation, a mini-environment robot 124, 224 removes a wafer from a wafer pod seated on a pod loader 116, 216 in the direction of arrow J (FIG. 2). The robot 124, 224 inserts the wafer into the wafer aligner 119, 219 in the direction of arrow K. After the wafer aligner 119, 219 aligns the wafer, the robot 124, 224 retrieves the wafer from the wafer aligner 119, 219 in the direction of arrow L. Finally, the robot 124, 224 places the wafer into the load lock chamber 108, 208 in the direction of arrow M. Thus, only four movements are required to handle a wafer from a pod loader 115–118, 215–218 to a load lock chamber 108, 109, 208, 209, unlike the six movements required by the prior art. Thus, the wafer moves only partially beyond the pathway that is directly from the pod loader 115–118, 215–218 to the load lock chamber 108, 109, 208, 209. In the event that the wafer is to be loaded into the load lock chamber 108, 109, 208, 209 on the opposite side of the wafer aligner 119, 219, then arrow L would point in the same direction as arrow K, and arrow M would point into the other load lock chamber 109, 209. Thus, the wafer moves directly in the pathway from the pod loader 116, 216 to the load lock chamber 109, 209 on the opposite side of the wafer aligner 119, 219.

While the foregoing is directed to the preferred embodiment of the present invention, other and further embodiments of the invention may be devised without departing from the basic scope thereof, and the scope thereof is determined by the claims which follow.

What is claimed is:

1. A wafer transferring chamber comprising:
   an enclosure disposed between a cassette and a load lock chamber defining an interior space, the enclosure having a first opening in communication with the cassette and a second opening in communication with the load lock chamber;
   a wafer aligner mounted substantially at a middle portion of the interior space and adapted to orient a wafer within a plane; and
   a wafer mover disposed within the interior space, the wafer mover being adapted to, transfer wafers between the cassette and the load lock chamber and being adapted to move by the wafer aligner.

2. The wafer transferring chamber of claim 1, wherein the wafer aligner is vertically positioned so that the wafer mover is adapted to laterally move a wafer at a vertical elevation different than the wafer aligner.

3. The wafer transferring chamber of claim 1, wherein the enclosure comprises:
   a first side wall; and
   a second side wall, the middle portion being located at a midpoint between the first side wall and the second side wall.

4. The wafer transferring chamber of claim 1, wherein the enclosure comprises:
   a front wall; and
   a rear wall, the middle portion being located at a midpoint between the front wall and the rear wall.

5. The wafer transferring chamber of claim 4, wherein the enclosure comprises a first side wall and a second side wall, the wafer aligner being mounted substantially at a midpoint between the first side wall and the second side wall.

6. The wafer transferring chamber of claim 1, wherein the enclosure comprises:
   a front wall; and
   a rear wall, wherein the wafer aligner has a wafer center insertion point located substantially at a midpoint between the front wall and the rear wall.

7. The wafer transferring chamber of claim 1, wherein the wafer mover is movable under the wafer aligner.

8. The wafer transferring chamber of claim 1, wherein the wafer mover is movable beside of the wafer aligner.

9. A method of handling a wafer in a vacuum processing system, comprising the steps of:
   (a) moving the wafer in a single motion in a first direction from a cassette into a chamber space of a chamber, the chamber being disposed between the cassette and a load lock chamber in the vacuum processing system, the chamber having a first opening in communication with the cassette and a second opening in communication with the load lock chamber;
   (b) transferring the wafer in a single motion in a second direction to a wafer aligner mounted substantially at a middle portion of the first chamber space;
   (c) orienting the wafer within a plane;
   (d) removing the wafer in a single motion in a third direction from the wafer aligner; and
   (e) inserting the wafer in a single motion in a fourth direction into the load lock chamber.

10. The method of claim 9, wherein:
   the vacuum processing system includes a first wafer mover disposed within the chamber space on a first side of the wafer aligner and a second wafer mover disposed within the chamber space on a second side of the wafer aligner;
   the first wafer mover and the second wafer mover are adapted to independently access the wafer aligner on the first side and the second side, respectively; and the first wafer mover performs steps (a) and (b) on the wafer on the first side; and the second wafer mover performs steps (c) and (d) on the wafer on the second side;

whereby the third direction is substantially the same as the second direction.

11. The method of claim 9, wherein:

the vacuum processing system includes a first wafer mover disposed within the chamber space on a first side of the wafer aligner and a second wafer mover disposed within the chamber space on a second side of the wafer aligner;

the first wafer mover and the second wafer mover are adapted to independently access the wafer aligner on the first side and the second side, respectively; and the first wafer mover and the second wafer mover both perform steps (a) through (d) on different wafers on the first side and the second side, respectively.

12. The method of claim 9, comprising the further step of:

after step (b), moving a wafer mover from a first side of the wafer aligner to a second side of the wafer aligner;

whereby the single third direction is substantially the same as the second direction.

13. The method of claim 9, further comprising: moving a wafer mover underneath the wafer aligner while step (c) is being performed.

14. The method of claim 9, further comprising:

(f) moving a second wafer into the chamber space from the load lock chamber while one or more of steps (a) through (e) are being performed.

15. The method of claim 14, wherein step (f) is being performed while step (c) is being performed.

16. A vacuum processing system, comprising:

a transfer chamber having an interior space;

a first wafer mover disposed within the interior space;

a second wafer mover disposed within the interior space;

a load lock chamber cooperatively engaged with the transfer chamber for receiving one or more wafers, the transfer chamber being disposed between a cassette and the load lock chamber, the transfer chamber having a first opening in communication with the cassette and a second opening in communication with the load lock chamber;

a vacuum chamber attached to the load lock chamber and adapted to receive the wafers from the load lock chamber;

a wafer aligner mounted substantially at a middle portion of the interior space of the transfer chamber and adapted to orient the wafers within a plane, wherein the wafer aligner is disposed between the first wafer mover and the second wafer mover;

the first wafer mover and the second wafer mover are adapted to independently access the wafer aligner on opposing sides of the wafer aligner;

the first wafer mover is adapted to insert a first wafer into the wafer aligner from a first side of the wafer aligner and remove the first wafer from the wafer aligner on the first side of the wafer aligner; and the second wafer mover is adapted to insert a second wafer into the wafer aligner from a second side of the wafer aligner and remove the second wafer from the wafer aligner on the second side of the wafer aligner.

17. The vacuum processing system of claim 16, wherein the first wafer mover and the second wafer mover are adapted to laterally move a wafer at a vertical elevation different than the wafer aligner.

18. The vacuum processing system of claim 16, wherein:

the transfer chamber has a first side wall and a second side wall; and the middle portion is located at a midpoint between the first side wall and the second side wall.

19. The vacuum processing system of claim 16, wherein:

the transfer chamber has a front wall and a rear wall; and the middle portion is located at a midpoint between the front wall and the rear wall.

20. The vacuum processing system of claim 16, wherein:

the transfer chamber has a front wall and a rear wall;

the wafer aligner has a wafer center insertion point; and the wafer center insertion point is located substantially at a midpoint between the front wall and the re wall.

21. A vacuum processing system, comprising:

a transfer chamber having an interior space;

a first wafer mover disposed within the interior space;

a second wafer mover disposed within the interior space;

a load lock chamber cooperatively engaged with the transfer chamber for receiving one or more wafers, the transfer chamber being disposed between a cassette and the load lock chamber, the transfer chamber having a first opening in communication with the cassette and a second opening in communication with the load lock chamber;

a vacuum chamber attached to the load lock chamber and adapted to receive the wafers from the load lock chamber;

a wafer aligner mounted substantially at a middle portion of the interior space of the transfer chamber and adapted to orient the wafers within a plane, wherein the wafer aligner is disposed between the first wafer mover and the second wafer mover;

the first wafer mover and the second wafer mover are adapted to independently access the wafer aligner on opposing sides of the wafer aligner;

the first wafer mover is adapted to insert a wafer into the wafer aligner from a first side of the wafer aligner; and the second wafer mover is adapted to remove the wafer from the wafer aligner on a second side of the wafer aligner.

22. The vacuum processing system of claim 21, wherein the first wafer mover and the second wafer mover are adapted to laterally move a wafer at a vertical elevation different than the wafer aligner.

23. The vacuum processing system of claim 21, wherein:

the transfer chamber has a first side wall and a second side wall; and the middle portion is located at a midpoint between the first side wall and the second side wall.

24. The vacuum processing system of claim 21, wherein:

the transfer chamber has a front wall and a rear wall; and the middle portion is located at a midpoint between the front wall and the rear wall.

25. The vacuum processing system of claim 21, wherein:

the transfer chamber has a front wall and a rear wall;

the wafer aligner has a wafer center insertion point; and the wafer center insertion point is located substantially at a midpoint between the front wall and the rear wall.

* * * * *

UNITED STATES PATENT AND TRADEMARK OFFICE
CERTIFICATE OF CORRECTION

PATENT NO. : 6,270,306 B1
DATED : August 7, 2001
INVENTOR(S) : Otwell et al.

It is certified that error appears in the above-identified patent and that said Letters Patent is hereby corrected as shown below:

<u>Column 10,</u>
Line 12, please delete " ,".

<u>Column 12,</u>
Line 16, please replace " re" with -- rear --.

Signed and Sealed this

Twenty-sixth Day of February, 2002

Attest:

JAMES E. ROGAN
*Attesting Officer*     *Director of the United States Patent and Trademark Office*